US012719033B2

(12) United States Patent
Ge et al.

(10) Patent No.: US 12,719,033 B2
(45) Date of Patent: Aug. 25, 2026

(54) CHAMBER WITH ENHANCEMENT LINER AND METHODS FOR DOWNSTREAM RESIDUE MANAGEMENT

(71) Applicant: Applied Materials, Inc., Santa Clara, CA (US)

(72) Inventors: Zaoyuan Ge, San Jose, CA (US); Manjunath Veerappa Chobari Patil, Karnataka (IN); Prodosh Kumar Halder, Kolkata (IN); Prasath Poomani, Tamilnadu (IN); Badri N. Ramamurthi, Los Gatos, CA (US); Sungwon Ha, Palo Alto, CA (US); Daemian Raj Benjamin Raj, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

(21) Appl. No.: 18/665,239

(22) Filed: May 15, 2024

(65) Prior Publication Data

US 2025/0357094 A1 Nov. 20, 2025

(51) Int. Cl.
*H01J 37/32* (2006.01)

(52) U.S. Cl.
CPC .... *H01J 37/32862* (2013.01); *H01J 37/3244* (2013.01); *H01J 37/32458* (2013.01); *H01J 2237/022* (2013.01)

(58) Field of Classification Search
None
See application file for complete search history.

(56) References Cited

U.S. PATENT DOCUMENTS

| | | | |
|---|---|---|---|
| 5,558,717 | A | 9/1996 | Zhao et al. |
| 2020/0251311 | A1 | 8/2020 | Ghosh et al. |
| 2022/0307135 | A1 | 9/2022 | Pathak et al. |
| 2022/0367151 | A1 * | 11/2022 | Aida .................. C23C 16/4405 |
| 2023/0146757 | A1 | 5/2023 | Fujikawa et al. |
| 2025/0140537 | A1 * | 5/2025 | Ge .................... H01J 37/32862 |

OTHER PUBLICATIONS

International Application No. PCT/US2025/029279, International Search Report and Written Opinion mailed on Sep. 1, 2025, 11 pages.

* cited by examiner

*Primary Examiner* — Kenneth B Wells

(74) *Attorney, Agent, or Firm* — Kilpatrick Townsend & Stockton LLP

(57) ABSTRACT

Semiconductor processing chambers and systems, as well as methods of cleaning such chambers and systems are provided. Processing chambers and systems include a chamber body that defines a processing region. Processing chambers and systems include an enhancement liner positioned within the chamber body that includes an interior portion, an exterior portion, and a plurality of apertures. The enhancement liner defines a liner volume between the interior portion and the exterior portion, and a distribution gap is defined between the enhancement liner and a sidewall of the chamber body. Processing chambers and systems include a faceplate disposed vertically above the enhancement liner. Processing chambers and systems include a cleaning gas source coupled with distribution gap through an inlet in the sidewall of the chamber body.

16 Claims, 10 Drawing Sheets

CHAMBER WITH ENHANCEMENT LINER AND METHODS FOR DOWNSTREAM RESIDUE MANAGEMENT

TECHNICAL FIELD

The present technology relates to semiconductor processes and equipment. More specifically, the present technology relates to substrate processing systems and components.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, some chambers include remote plasma sources in order to generate higher power plasmas without damaging substrates. However, such plasma sources are generally located upstream of a showerhead and/or blocking plate, limiting the plasma radicals that reach the chamber.

Thus, there is a need for improved systems and methods that can be used to efficiently clean downstream portions of a semiconductor chamber. These and other needs are addressed by the present technology.

SUMMARY

The present technology is generally directed to substrate processing systems and enhancement liners for enhanced cleaning of chamber components. Substrate processing systems include a chamber body that defines a processing region, an enhancement liner, a faceplate disposed vertically above the enhancement liner, and a cleaning gas source coupled with a distribution gap through an inlet in the sidewall of the chamber body. Substrate processing systems include where the enhancement liner is positioned within the chamber body and include an interior portion, an exterior portion, and a plurality of apertures, where the enhancement liner defines a liner volume between the interior portion and the exterior portion, and a distribution gap is defined between the enhancement liner and a sidewall of the chamber body.

In embodiments, the cleaning gas source is positioned vertically below the chamber body. Furthermore, in embodiments, the plurality of apertures fluidly connect the distribution gap and the liner volume. In more embodiments, the exterior portion of the enhancement liner includes a laterally extending portion and a vertically extending portion, where the laterally extending portion extends from the sidewall of the chamber body towards a substrate support disposed in the processing region. Additionally or alternatively, in embodiments, the vertically extending portion is laterally spaced apart from the sidewall of the chamber body towards the substrate support. In yet more embodiments, the enhancement liner defines a first cleaning gas flow path between the inlet and an exhaust outlet and a second cleaning gas flow path between the inlet and the exhaust outlet, wherein the first cleaning gas flow path length is less than the second cleaning gas flow path length. Embodiments include where the distribution gap has a gap width between the sidewall of the chamber body and the vertically extending portion, where the gap width of the distribution gap along the first cleaning gas flow path is greater than the gap width of the distribution gap along the second cleaning gas flow path. In embodiments, a diameter or equivalent diameter of one or more apertures of the plurality of apertures disposed along the second cleaning gas flow path is greater than a diameter or equivalent diameter of one or more apertures of the plurality of apertures disposed along the first cleaning gas flow path. Moreover, in embodiments, the plurality of apertures are disposed along the exterior portion at a height less than a height of a substrate support in a processing position. In further embodiments, a liner is seated on the enhancement liner that includes an interior portion and an exterior portion, where the interior portion and the exterior portion of the liner defines a portion of the liner volume, and a pumping liner is seated on the liner. In embodiments, systems also include a lower liner fluidly connecting an exhaust outlet to the liner volume. Embodiments include where the exterior portion of the enhancement liner has a first laterally extending portion and a vertically extending portion, wherein the laterally extending portion extends from the sidewall of the chamber body towards a substrate support disposed in the processing region. In embodiments, systems include a second laterally extending portion, where the vertically extending portion extends between the first laterally extending portion and the second laterally extending portion, and the plurality of apertures are formed in the vertically extending portion.

The present technology is also generally directed to enhancement liners. Liners include an exterior portion having a first laterally extending portion adjacent to a bottom surface of the exterior portion, a second laterally extending portion adjacent to a top surface of the exterior portion, and a vertically extending portion extending between the first laterally extending portion and the second laterally extending portion. Enhancement liners include where the first laterally extending portion, second laterally extending portion, and vertically extending portion at least partially define a distribution volume. Enhancement liners include an interior portion spaced apart from the exterior portion, defining an annular liner volume therebetween. Enhancement liners include a plurality of apertures disposed through the exterior portion, fluidly connecting the distribution volume and the annular liner volume. Enhancement liners include where the first laterally extending portion and/or the second laterally extending portion extend to a first diameter, the vertically extending portion extends to a second diameter, and the interior portion extends to a third diameter, wherein the first diameter is greater than the second diameter, and the second diameter is greater than the third diameter.

In embodiments, the exterior portion includes a first perimeter portion and a second perimeter portion, where the vertically extending portion comprises a first thickness along the first perimeter portion and a second thickness along the second perimeter portion, where the second wall thickness is greater than the first wall thickness. Furthermore, in embodiments, the plurality of apertures include a first plurality of apertures extending along the first perimeter portion and a second plurality of apertures extending along the second perimeter portion, where an average diameter of the first plurality of apertures is greater than an average diameter of the second plurality of apertures.

The present technology is also generally directed to processing methods. Methods include flowing a cleaning gas or a plasma precursor into a processing region of a semiconductor processing chamber. The semiconductor processing chamber includes an enhancement liner positioned within the semiconductor processing chamber having an interior portion, an exterior portion, and a plurality of apertures, where the enhancement liner defines a liner volume between the interior portion and the exterior portion, and a distribution gap is defined between the enhancement liner and a sidewall of the semiconductor processing chamber. Semiconductor processing chambers include a faceplate disposed vertically above the enhancement liner and a second cleaning gas source coupled with a distribution gap through an inlet in the sidewall of the semiconductor processing chamber. Methods include flowing a second cleaning gas from the second cleaning gas source into the distribution gap through the inlet, and exhausting the second cleaning gas through the liner volume.

In embodiments, the cleaning gas is flowed into the processing region and the second cleaning gas is flowed into the distribution gap simultaneously with the flowing of the cleaning gas into the processing region. Moreover, in embodiments, the plasma precursor is flowed into the processing region, and the second cleaning gas is flowed into the distribution gap simultaneously with the flowing of the plasma precursor into the processing region. In further embodiments, the plasma precursor includes a carbon containing precursor.

Such technology may provide numerous benefits over conventional systems and techniques. For example, the processing systems may provide standalone cleaning capabilities that can reduce residues in downstream locations. Additionally, such processes may be utilized in conjunction with existing clean operations, allowing for enhanced cleaning alone or in conjunction with reduced cleaning gas utilization. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figures 1, 2:
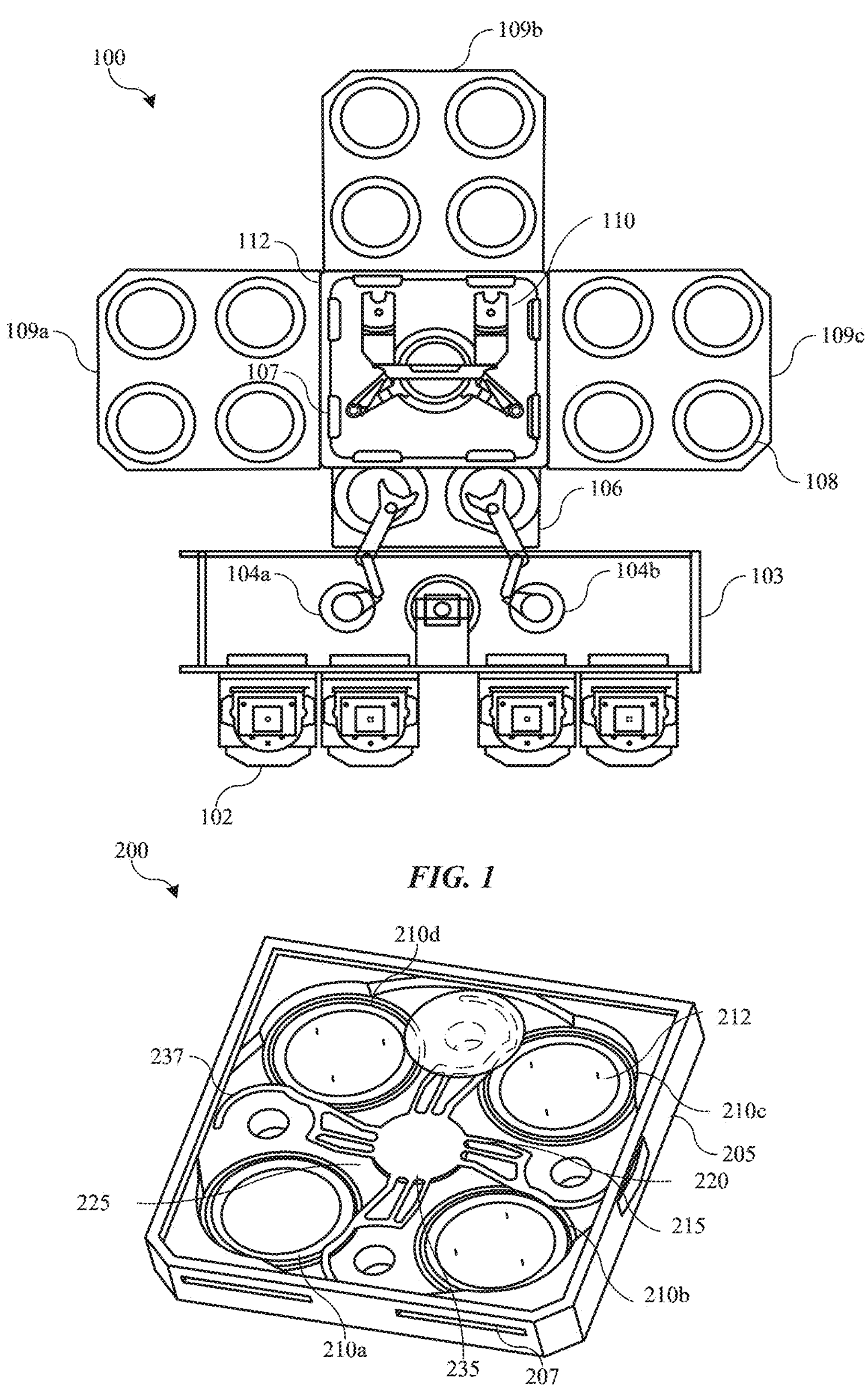
FIG. 1 shows a schematic top plan view of an exemplary processing system according to embodiments of the present technology.
FIG. 2 shows a schematic isometric view of a transfer region of an exemplary chamber system according to embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Particle contamination within semiconductor chambers is typically controlled by periodically cleaning the chamber using cleaning gases, such as fluorinated or oxygenated compounds, which are excited to inductively or capacitively coupled plasmas. Cleaning gases are selected based on their ability to bind the precursor gases and the deposition material, which has formed on the chamber components, or remain in the chamber processing volume, in order to form stable volatile products which can be exhausted from the chamber, thus cleaning the process environment. However, these existing cleaning solutions require purging of the entire chamber between processes, utilizing large volumes of cleaning gas and allowing large amounts of deposits to form between cleanings.

Moreover, existing plasma cleaning gasses are generated upstream from the processing chamber. Such cleaning devices and methods therefore flow cleaning gasses through one or more components, such as faceplates and blocker plates in order to reach the processing region. Due to the orientation of the plasma source upstream from the processing region, existing cleaning processes often fail to clean around the pumping liner and exhaust, as well the underside of the faceplate. Namely, due to the length of the flow path as well as the large area of exposed surface on faceplates, a majority of the generated radicals recombine as the cleaning gas is flowed into the chamber. Therefore, current cleaning methods often fail to adequately clean the underside of the faceplate (e.g. the processing region facing surface), pumping liner, isolator and exhaust valve, as examples only, which may be referred to as chamber components herein.

In order to clean a chamber that has become fouled, which is a frequent occurrence when utilizing carbon based precursors that exhibit a high risk of component fouling, the chamber must be cooled to a temperature where the cleaning gas will not interact with the chamber components. As may be apparent, such a process requires removing the chamber from processing for an extended amount of time. After the chamber has been cooled and sufficiently cleaned of the process gases and the cleaning by-products have been exhausted out of the chamber, a season process is performed to deposit a film onto components of the chamber forming the processing volume to seal remaining contaminants therein and reduce the contamination level during processing. This process is typically carried out by depositing a season film to coat the interior surfaces forming the processing volume of the chamber. Such a process therefore requires a significant amount of down time as well as product usage.

Attempts have been made to utilize a secondary, standalone cleaning gas source. However, existing secondary cleaning gas sources have been found to clean in a non-uniform manner, as well as backflow cleaning gasses into the process volume. This has proven further problematic, as the secondary cleaning gas may degrade the chamber components, reducing the lifespan of the components.

The present technology has overcome these and other problems by fluidly connecting a standalone cleaning gas source (such as a remote plasma source "RPS") to one or more chambers via an enhancement liner. The enhancement liner may be disposed in a lower portion of the processing region of the chamber (e.g. below the faceplate) and defines a distribution gap, having a distribution gap volume, between a chamber sidewall and an exterior surface of the enhancement liner. A cleaning gas inlet may extend through the chamber sidewall and fluidly connect the cleaning gas source to the distribution gap volume. The exterior surface of the enhancement liner may have a plurality of apertures connecting the distribution gap to a liner volume, and the distribution gap may define one or more flow paths having the same or different flow conductance, based on the path length between the inlet and the exhaust outlet. By utilizing such an arrangement, the cleaning gas generated by the additional cleaning gas source (e.g. in addition to a RPS utilized for conventional cleaning or to provide process precursors) is able to more uniformly distribute a secondary cleaning gas into a liner volume, allowing the cleaning gas to contact the liner volume alone or in combination with one or more chamber components below the showerhead, such as the pumping liner, underside of the shower head, and the exhaust lines and valves, as examples only, without having to first pass through a showerhead or blocker plate, and with reduced or eliminated risk of backflow into the processing volume.

Furthermore, due to the unique location of the cleaning gas source and the pumping liner apertures, the RPS may be mounted under the chamber(s), and therefore not require an expansion of the footprint of the system while also providing a desirably short flow path. The modified pumping liner fluidly connected to an additional standalone cleaning gas source may also allow an additional cleaning gas to be generated and flowed during traditional cleaning processes or during deposition processes, reducing the volume of cleaning gas needed to clean the chamber and components therein, particularly as the enhancement liner reduces or eliminates risk of backflow of the secondary cleaning gas into the process volume. Thus, the additional cleaning gas source and unique orientation of the pumping liner discussed herein may allow the cleaning gas to react with residues, during or after processing, forming a gaseous exhaust that does not foul component parts.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports **210*a* or 210*b* through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205**.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports **210*a* and 210*b* to substrate supports 210*c* and 210*d***, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
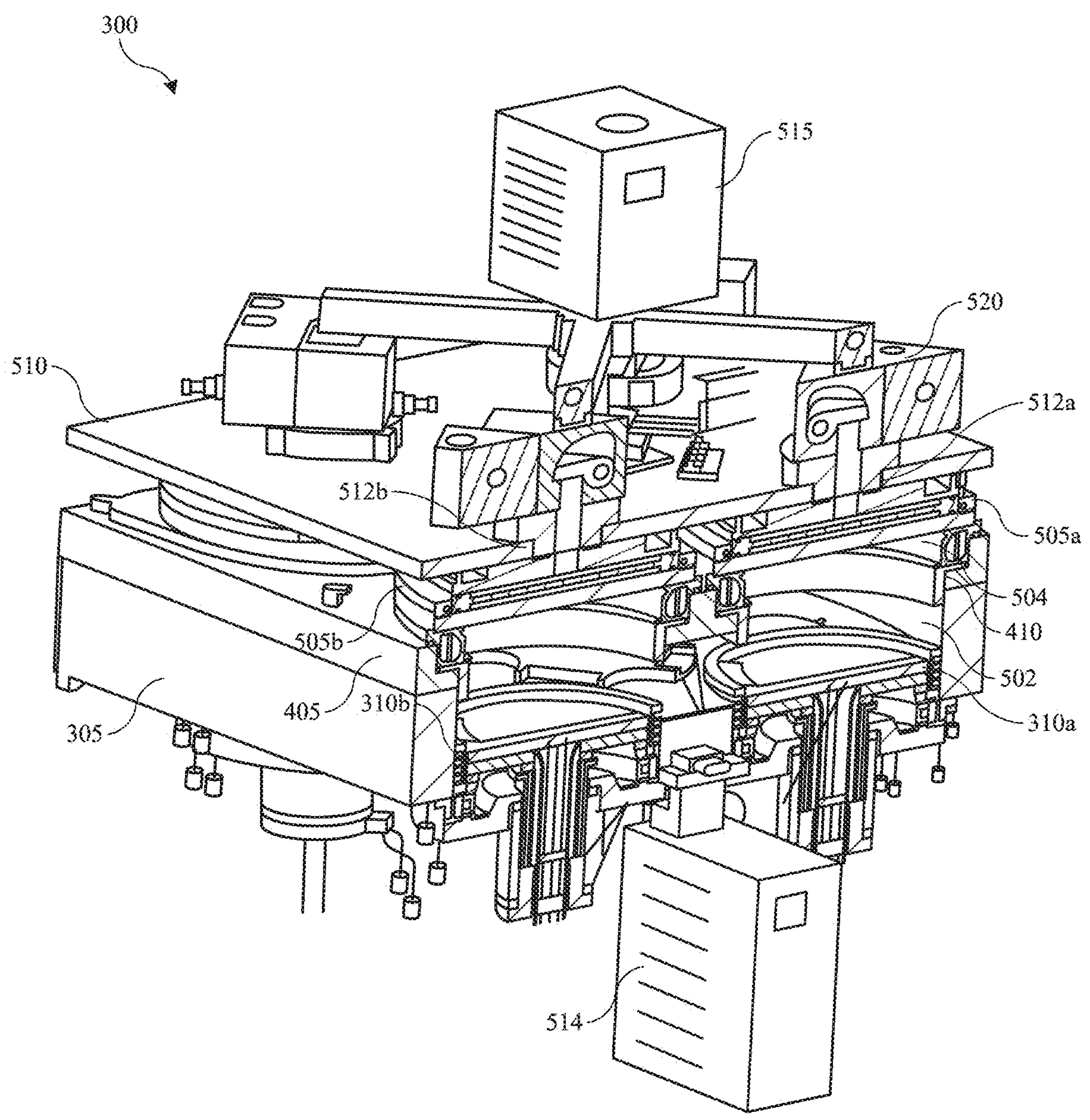
FIG. 3 shows a partial isometric view of a chamber system according to embodiments of the present technology.

FIG. 3 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505*a* may be aligned over substrate support 310*a*, and lid stack 505*b* may be aligned over substrate support 310*b*. When raised to operational positions, such as a second position, the substrates may deliver substrates for individual processing within the separate processing regions. When in this position, as will be described further below, each processing region 504 may be at least partially defined from below by an associated substrate support in the second position.

FIG. 3 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. Moreover, as will be discussed in greater detail below, embodiments according to the present technology include a cleaning gas source 514, which may be an RPS, that is separate from the remote plasma unit 515 discussed above. In embodiments, the cleaning gas source 514 may be mounted below processing region 504 and may be fluidly connected with the processing region 504 at a position below lid stack 505 (discussed in greater detail in FIGS. 5A-8C).

In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512*a* may provide fluid access to lid stack 505*a*. Aperture 512*a* may also be axially aligned with any of the lid stack components, as well as with substrate support 310*a* in some embodiments, which may produce an axial alignment for each of the components associated with individual processing regions, such as along a central axis through the substrate support or any of the components associated with a particular processing region 504. Similarly, aperture 512*b* may provide fluid access to lid stack 505*b*, and may be aligned, including axially aligned with components of the lid stack as well as substrate support 310*b* in some embodiments.

Figure 4:
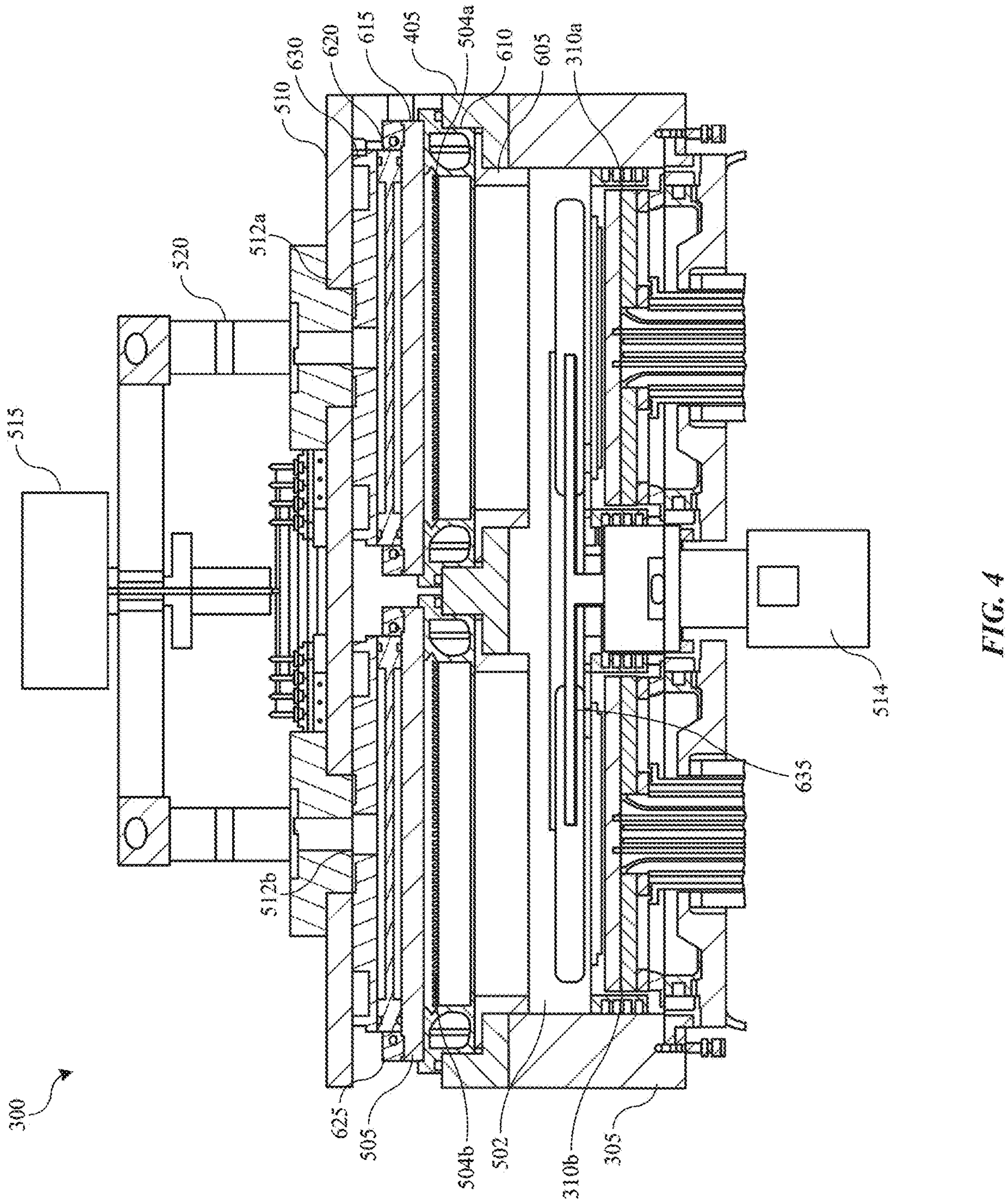
FIG. 4 shows a schematic partial cross-sectional view of an exemplary chamber system according to embodiments of the present technology.

FIG. 4 shows a schematic cross-sectional elevation view of one embodiment of chamber system 300 according to some embodiments of the present technology. FIG. 4 may illustrate the cross-sectional view shown above in FIG. 3, and may further illustrate components of the system. The figure may include components of any of the systems illustrated and described previously, and may also show further aspects of any of the previously described systems. It is to be understood that the illustration may also show exemplary components as would be seen through any two adjacent processing regions 108 in any quad section 109 described above. However, while not shown, it should be understood that, in embodiments, the components discussed herein may be applicable to chambers having more or less than four sections, such as single chamber sections, double chamber sections, or others as known in the art.

The elevation view may illustrate the configuration or fluid coupling of one or more processing regions 504 with a transfer region 502. For example, a continuous transfer region 502 may be defined by chamber body 305. The housing may define an open interior volume in which a number of substrate supports 310 may be disposed. For example, as illustrated in FIG. 1, exemplary processing systems may include four or more, including a plurality of substrate supports 310 distributed within the chamber body about the transfer region. The substrate supports may be pedestals as illustrated, although a number of other configurations may also be used. In some embodiments the pedestals may be vertically translatable between the transfer region 502 and the processing regions 504 overlying the transfer region. The substrate supports may be vertically translatable along a central axis of the substrate support along a path between a first position and a second position within the chamber system. Accordingly, in some embodiments each substrate support 310 may be axially aligned with an overlying processing region 504 defined by one or more chamber components.

The open transfer region may afford the ability of a transfer apparatus 635, such as a carousel, to engage and move substrates, such as rotationally, between the various substrate supports. The transfer apparatus 635 may be rotatable about a central axis. This may allow substrates to be positioned for processing within any of the processing regions 504 within the processing system. The transfer apparatus 635 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 635 and deliver the substrates into the processing regions 504, which may be vertically offset from the transfer region 502. For example, and as illustrated, substrate support 310*a* may deliver a substrate into processing region 504*a*, while substrate support 310*b* may deliver a substrate into processing region 504*b*. This may occur with the other two substrate supports and processing regions, as well as with additional substrate supports and processing regions in embodiments for which additional processing regions are included. In this configuration, the substrate supports may at least partially define a processing region 504 from below when operationally engaged for processing substrates, such as in the second position, and the processing regions may be axially aligned with an associated substrate support. The processing regions may be defined from above by the components of the lid stacks 505, which may each include one or more of the illustrated components. In some embodiments, each processing region may have individual lid stack components, although in some embodiments components may accommodate multiple processing regions 504. Based on this configuration, in some embodiments each processing region 504 may be fluidly coupled with the transfer region, while being fluidly isolated from above from each other processing region within the chamber system or quad section.

The lid stack 505 may include a number of components, which may facilitate flow of precursors through the chamber system, and may be at least partially contained between the first lid plate 405 and the second lid plate 510. A liner 605 may be seated directly on the shelf formed by each recessed ledge in first lid plate 405. For example, liner 605 may define a lip or flange, which may allow liner 605 to extend from the shelf of first lid plate 405. Liner 605, alone or in combination with pumping liner 610 may extend vertically below the first surface of first lid plate 405 as will be discussed in greater detail below, and may at least partially extend into the open transfer region 502. The liner 605 may be made of materials similar to or different from the chamber body materials, and may be or include materials that limit deposition or retention of materials on the surface of liner 605. Liner 605 may define an access diameter for substrate support 310, and may be characterized by any of the gap amounts described above for clearance between the substrate support 310 and the liner 605 when included.

Seated on the liner 605 may be a pumping liner 610, which may at least partially extend within the recess or along the recessed ledge defined in the second surface of first lid plate 405. In some embodiments, pumping liner 610 may be seated on liner 605 on the shelf formed by the recessed ledge. Pumping liner 610 may be an annular component, and may at least partially define the processing region 504 radially, or laterally depending on the volume geometry. The pumping liner may define an exhaust plenum within the liner, which may define a plurality of apertures on an inner annular surface of the pumping liner providing access to the exhaust plenum. The exhaust plenum may at least partially extend vertically above a height of the first lid plate 405, which may facilitate delivering exhausted materials through an exhaust channel formed through the first lid plate and chamber body as previously described. However, in embodiments, as will be discussed in greater detail below, all or a portion of the exhaust may exit through an exhaust port in a bottom surface of the chamber body 305. A portion of the pumping liner may at least partially extend across the second surface of the first lid plate 405 to complete the exhaust channel between the exhaust plenum of the pumping liner, and the channel formed through the chamber body and first lid plate.

A faceplate 615 may be seated on the pumping liner 610, and may define a plurality of apertures through the faceplate 615 for delivering precursors into the processing region 504. Faceplate 615 may at least partially define an associated processing region 504 from above, which may at least partially cooperate with the pumping liner and substrate support in a raised position to generally define the processing region. Faceplate 615 may operate as an electrode of the system for producing a local plasma within the processing region 504, and thus in some embodiments, faceplate 615 may be coupled with an electrical source or may be grounded. In some embodiments the substrate support 310 may operate as the companion electrode for generating a capacitively-coupled plasma between the faceplate and the substrate support.

A blocker plate 620 may be seated on the faceplate 615, which may further distribute processing fluids or precursors to produce a more uniform flow distribution to a substrate. Blocker plate 620 may also define a number of apertures through the plate. In some embodiments the blocker plate 620 may be characterized by a diameter less than a diameter of the faceplate as illustrated, which may provide an annular access on the surface of the faceplate radially outward from the blocker plate 620. In some embodiments a faceplate heater 625 may be seated on the annular access, and may contact faceplate 615 to heat the component during processing or other operations. In some embodiments, blocker plate 620 and faceplate heater 625 may be characterized together as having an outer radial diameter equal to or substantially equal to an outer radial diameter of faceplate 615. Similarly, faceplate heater 625 may be characterized as having an outer radial diameter equal to or substantially equal to an outer radial diameter of faceplate 615 in some embodiments. Faceplate heater 625 may extend about blocker plate 620, and may or may not directly contact blocker plate 620 on an outer radial edge of the blocker plate 620.

A gas box 630 may be positioned above the blocker plate 620, and the gas box 630 of each of the lid stacks 505 may at least partially support the second lid plate 510. Gas box 630 may define a central aperture that is aligned with an associated aperture 512 of the plurality of apertures defined through second lid plate 510. Second lid plate 510 may support a remote plasma unit 515 in some embodiments, which may include piping to each of the apertures 512, and into each processing region 504. Adapters may be positioned through apertures 512 to couple the remote plasma unit piping to the gas boxes 630. Additionally, isolation valves 520 may be positioned within the piping to meter flow to each individual processing region 504 in some embodiments.

O-rings or gaskets may be seated between each component of the lid stack 505, which may facilitate vacuum processing within chamber system 300 in some embodiments. The specific component coupling between the first lid plate 405 and the second lid plate 510 may occur in any number of ways, which may facilitate accessing system components. For example, a first set of couplings may be incorporated between the first lid plate 405 and the second lid plate 510, which may facilitate removal of both lid plates and each lid stack 505, which may provide access to the substrate supports or transfer apparatus within the transfer region of the chamber system. These couplings may include any number of physical and removable couplings extending between the two lid plates, which may allow them to be separated from the chamber body 305 as a whole. For example, a drive motor on a mainframe containing the chamber system 300 may be removably coupled with the second lid plate 510, which may lift the components away from the chamber body 305.

When the couplings between the first lid plate 405 and second lid plate 510 are disengaged, second lid plate 510 may be removed while first lid plate 405 may remain on chamber body 305, which may facilitate access to one or more components of the lid stacks 505. The break within the lid stack 505 may occur between any two components described previously, some of which may be coupled with first lid plate 405, and some of which may be coupled with second lid plate 510. For example, in some embodiments each of the gas boxes 630 may be coupled with second lid plate 510. Thus, when the second lid plate is lifted from the chamber system, the gas boxes may be removed, providing access to the blocker plate and faceplate. Continuing this example, the blocker plate 620 and faceplate 615 may or may not be coupled with the first lid plate 405. For example, although mechanical coupling may be included, the components may be decoupled and sit floating on the first lid plate 405, such as with locating features maintaining proper alignment of the components. It is to be understood that the example is intended to be non-limiting, and illustrative of any number of break configurations between any two components of the lid stack when the second lid plate 510 is separated from the first lid plate 405. Consequently, depending on the coupling between the first lid plate and second lid plate, the entire lid stack and both lid plates may be removed providing access to the transfer region, or the second lid plate may be removed providing access to the lid stack components.

Referring next to FIGS. 5A-5C and 6, a partial cross-sectional view of a chamber system 300 according to embodiments of the present technology is shown. FIGS. 5A-5C and 6 may illustrate the cross-sectional view shown above in FIGS. 3 and/or 4 or alternatively a dual chamber configuration, and may further illustrate components of the system. The figure may include components of any of the systems illustrated and described previously, and may also show further aspects of any of the previously described systems. As illustrated, the cleaning gas source 514 may be fluidly connected to cleaning gas distribution gap 609 formed between a sidewall 306 of chamber body 305 and an exterior portion 606*a* of enhancement liner 606. As illustrated, in embodiments, the fluid connection may be a direct connection between the cleaning gas source 514 and distribution gap 609 through one or more flow paths (discussed in greater detail in regards to FIG. 6). Namely, the present technology has surprisingly found that by carefully forming a distribution gap 609, a tailored flow conductance may be provided through a plurality of apertures 608 formed in exterior portion 606*a* of enhancement liner 606 that fluidly connect the distribution gap 609 and the annular enhancement liner volume 617. Due at least in part to the distribution gap and the plurality of apertures, a flow conductance of a cleaning gas may be carefully controlled so as to be relatively evenly distributed throughout the annular enhancement liner volume 617, which extends around an exterior of processing region 504. Stated differently, a flow conductance may be carefully controlled thorough the plurality of apertures 608 spaced apart around a perimeter of the exterior portion 606*a* of the enhancement liner. Such an orientation may provide for enhanced cleaning, as the gas is more evenly distributed throughout the enhancement liner volume 617, which may therefore clean portions of the enhancement liner volume 617 spaced apart from an inlet 607 and/or outlet 612, as well as prevent backflow into the processing region as the flow of cleaning gas is more uniformly distributed.

In embodiments, enhancement liner 606 may be at least partially seated on a bottom wall 309 of the chamber body 305. As illustrated, the enhancement liner 606 may include an exterior portion 606*a* and an interior portion 606*b*, which may be interior and exterior walls, or portions thereof, defining all or a portion of a liner volume 617 therebetween. Namely, as illustrated, in embodiments, the exterior portion 606*a* may be seated on a bottom wall 309 of the chamber body 305 in order to support the placement of the enhancement liner 606. However, an interior portion 606*b* may have a reduced height as compared to the exterior portion 606*a*, in order to provide a fluid connection between the liner volume 617 and exhaust outlet 612. In such embodiments, the interior portion 606*b* may generally extend between liner 605 and lower liner 618, defining a vertical gap between a lower surface of interior portion 606*b* and bottom wall 309 of the chamber body. Thus, the interior portion may exhibit a height, measured from a top wall to a bottom wall of the interior portion, that is less than a height of the exterior portion, measured from a top wall to a bottom wall of the exterior portion.

For instance, in embodiments, a lower liner 618 may define an extension of the liner volume 617*a*, connecting the liner volume to exhaust outlet 612 along the bottom of purge volume 506. In such embodiments, the lower liner 618 may have a vertically extending portion 618*a* that extends from bottom wall 309 at a location between substrate support 310 and exhaust outlet 612 in a vertical manner generally parallel to chamber sidewall 306, and a laterally extending portion 618*b* that extends from the vertically extending portion 618*a* towards sidewall 306, and terminates at a location between the exhaust outlet 612 and chamber sidewall 306. In embodiments, the vertically extending portion 618*a* may be generally orthogonal to laterally extending portion 618*b*. With such an arrangement, the lower liner 618 may isolate the exhaust outlet 612 so as to not be directly connected to the purge volume 506. Thus, any flow of cleaning gas or process gas (or purge gas) may be exhausted from the chamber 300 or the cleaning gas inlet 607 through liner volume 617 and into the liner volume extension 617*a*. For instance, while the location of liner 605 and/or enhancement liner 606 between the substrate support 310 and the chamber sidewall 306 may be generally constrained by the substrate support 310, lower liner 618 may extend to incorporate one or more additional features and/or chamber components desired to be cleaned.

In embodiments, the vertically extending portion 618*a* of the lower liner may generally extend from a bottom wall 309 of the chamber body to a height that is less than a height of the cleaning gas inlet 607 and/or a height of one or more apertures 608. For instance, the cleaning gas inlet 607 may be disposed in sidewall 306 at a height h extending from the bottom wall 309 to the bottom of the cleaning gas inlet 607. Similarly, the apertures 608 may be disposed at a height $h_2$ along exterior portion 606*a* extending from bottom wall 309 to the bottom of the respective aperture 608, that is less than the height of the cleaning gas inlet. With such an arrangement, flow of cleaning gas may be prevented from flowing directly from the cleaning gas inlet 607 to the exhaust outlet 612. Nonetheless, in embodiments, the vertically extending portion may have a height that is generally higher than the cleaning gas inlet and/or one or more apertures, as the distribution gap may provide for improved flow uniformity. Thus, as illustrated, in embodiments, the exhaust outlet 612 may be disposed within the region of the chamber encompassed by the liner volume, allowing enhanced cleaning of the exhaust and valves therein.

In embodiments exterior portion 606*a* of enhancement liner 606 may have one or more laterally extending portions 606*c* and one or more vertically extending portions 606*d*. Namely, in order to form distribution gap 609 between the chamber sidewall 306 and the enhancement liner 606, one or more laterally extending portions 606*c* of exterior portion 606*a* may be utilized such that a vertically extending portion 606*d* of the exterior portion 606*a* may be spaced apart from sidewall 306. Stated differently, in embodiments, exterior portion 606*a* may extend to a first diameter corresponding to an exterior diameter D1 of laterally extending portion or portions 606*c* and have a second diameter D2 corresponding to an interior diameter of vertically extending portion 606*d*, as shown more clearly in FIG. 5B. Moreover, as illustrated, in embodiments, laterally extending portion(s) 606*c* and vertically extending portions(s) 606*d* may define, or at least partially enclose, a distribution volume 609. As will be discussed in greater detail below, in embodiments, chamber sidewall 306 may act to fully enclose the volume defined by the exterior portion 606*a* of the enhancement liner.

Figure 5A:
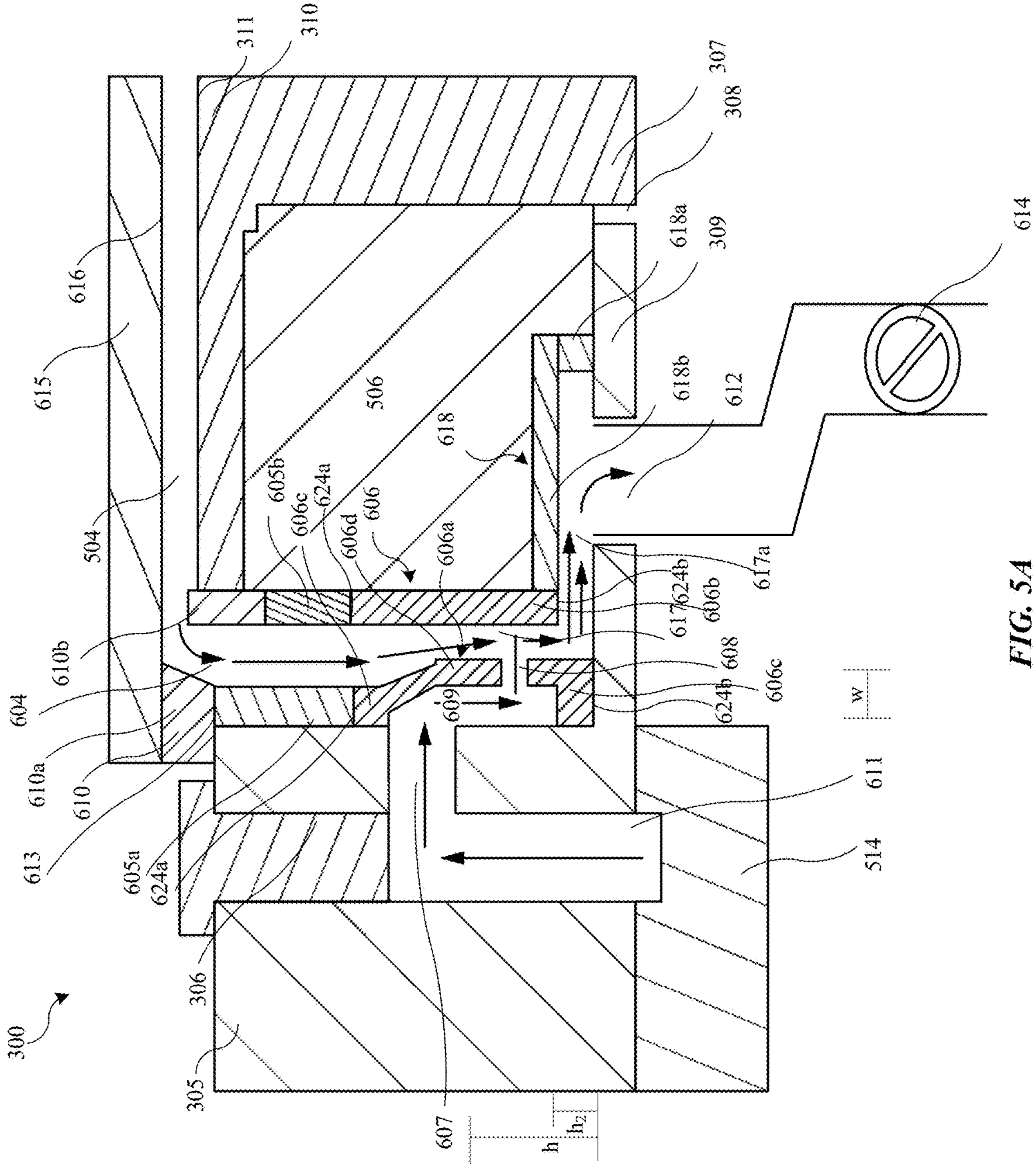
FIG. 5A shows a schematic partial cross-sectional view of an exemplary chamber system according to embodiments of the present technology.
Figures 5B, 5C:
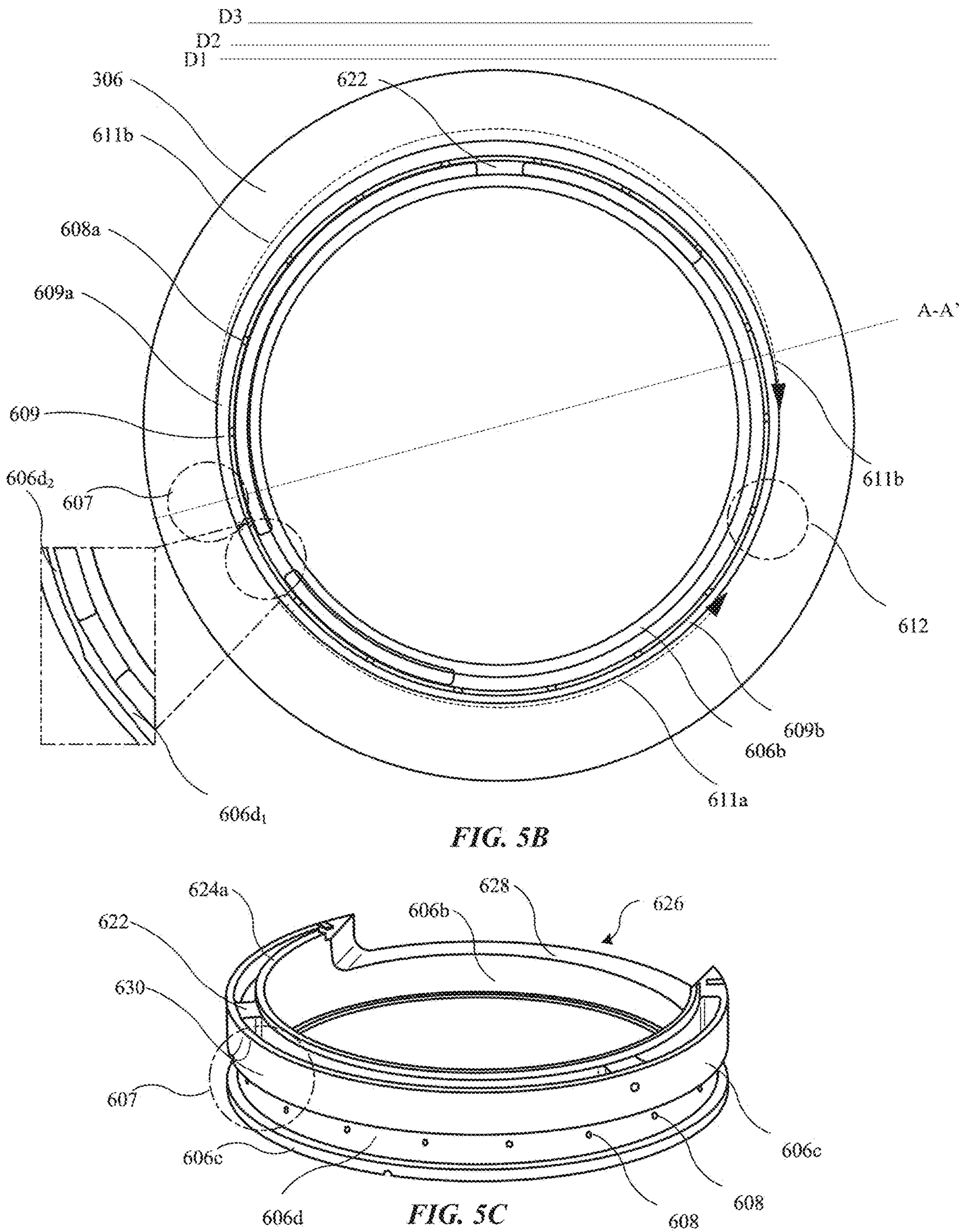
FIGS. 5B and 5C show views of an enhancement liner according to embodiments of the present technology.

As shown more clearly in FIG. 5C, in embodiments, the laterally extending portion 606*c* of exterior portion 606*a* may have varied widths depending upon their placement around the chamber. For instance, in embodiments, a path length of the flow of cleaning gas from the cleaning gas inlet 607 to the exhaust outlet 612 may be asymmetric. Thus, a gap width w of the distribution gap may be larger at a portion of the chamber corresponding to a shorter flow path and narrow at a portion of the chamber corresponding to a longer flow path, in order to more uniformly distribute cleaning gas to the plurality of apertures. Nonetheless, in embodiments, the laterally extending portion(s) 606*c* may have a width or thickness, so as to define a distribution gap 609 width of greater than or about 0.1 cm, such as greater than or about 0.15 cm, such as greater than or about 0.2 cm, such as greater than or about 0.25 cm, such as greater than or about 0.3 cm, such as greater than or about such as greater than or about 0.35 cm, such as greater than or about 0.4 cm, such as greater than or about 0.45 cm, such as greater than or about 0.5 cm, such as greater than or about 0.55 cm, such as greater than or about 0.6 cm, such as greater than or about 0.75 cm, such as greater than or about 0.8 cm, such as greater than or about 0.85 cm, such as greater than or about 0.9 cm, such as greater than or about 1 cm, or such as less than or about 1.5 cm, such as less than or about 1.25 cm, such as less than or about 1 cm, such as less than or about 0.75 cm, such as less than or about 0.7 cm, such as less than or about 0.65 cm, such as less than or about 0.6 cm, or such as less than or about 0.55 cm, or any ranges or values therebetween.

In the illustrated embodiments, a first laterally extending portion 606*c* disposed adjacent to bottom surface 624*b* and/or bottom wall 309 may have a greater width than a second laterally extending portion 606*c* adjacent to top wall 624*a* and/or liner 605. However, it should be clear that, in embodiments, both the first and second laterally extending portions 606*c* may have a width that is substantially similar, such that vertically extending portion 606*d* extends in a generally vertical manner. However, in embodiments, in order to further direct the flow to apertures 608, all or a portion of the vertically extending portion 606*d* may extend in a sloped or diagonal direction from laterally extending portion 606*c* towards apertures 608. In embodiments, the vertically extending portion may extend in a direction generally parallel to sidewall 306 or perpendicular to top surface 624*a*/bottom surface 624*b* from bottom surface 309 to a height above at least a portion of the plurality of apertures 608, at which point the vertically extending portion may slope or extend in a direction having both vertical and horizontal aspects, towards liner 605, where the vertically extending portion connects with laterally extending portion 606*c*.

Nonetheless, liner 605 may extend along one or more sidewalls 306 of the chamber body 305 and may be seated on enhancement liner 606. In embodiments, an exterior portion 605*a* of liner 605 may extend in a generally vertical direction along the perimeter of one or more sidewalls 306, such as generally around an exterior perimeter of the interior of the chamber body (e.g. circumferentially if the chamber is circular). In such embodiments, the exterior portion 605*a* may extend along chamber sidewall 306 from a faceplate 615 to a top surface of an exterior portion 606*a* of the enhancement liner, and an exterior portion 606*a* of the enhancement liner may extend from a bottom surface of liner 605 to bottom wall 309. However, in embodiments, such as discussed above, a pumping liner 610 may be disposed above liner 605. Thus, in embodiments where a pumping liner 610 is utilized, the exterior portion 605*a* of liner 605 may extend from a lower surface of an exterior portion 610*a* of pumping liner 610 to a top surface of the enhancement liner, such that the pumping liner 610 is disposed between exterior portion 605*a* and faceplate 615, and the enhancement liner extends between the liner 605 and bottom wall 309. Nonetheless, in embodiments, it should be understood that the pumping liner 610, liner 605, and/or enhancement liner 606 may be multiple discrete sections of a continuous liner, or may be individual liners seated upon the underlying liner.

As may be clear from the above, in embodiments, the enhancement liner 606 may be disposed vertically below faceplate 615, such as in a lower portion of the processing region 504. By utilizing such an arrangement, the cleaning gas source 514, which may also include a separate remote plasmas source (RPS), as well as any other cleaning gas source, may directly clean chamber components without first traversing faceplate 615. In embodiments, the distribution gap 609 may be fluidly connected to the cleaning gas source 514 via a cleaning gas inlet 607 extending through sidewall 306 of chamber body 305. However, in embodiments, the cleaning gas inlet 607 may be disposed at any one or more locations below processing region 504 and/or faceplate 615 (e.g. between processing region 504/faceplate 615 and bottom wall 309 of chamber body 305), such as on bottom wall 309. Moreover, while only one cleaning gas inlet 607 is illustrated, in embodiments, the cleaning gas inlet 607 may extend through the chamber sidewall 306 and circumferentially around chamber body 305, with one or more cleaning gas inlets 607 fluidly connecting the cleaning gas plenum to the distribution gap volume 609. However, as discussed above, in embodiments, the present technology may contain less than or about four inlets, less than or about three inlets, less than or about two inlets, such as one inlet, or any ranges or values therebetween, as the improvement in cleaning gas flow uniformity may be addressed by the unique design of the enhancement liner, such that multiple inlet apertures do not need to be formed in chamber body 305 and/or chamber sidewall 306.

In embodiments, interior portion 605*b* of liner 605, interior portion 606*b* of enhancement liner 606, and/or interior portion 610*b* of pumping liner 610, may be laterally spaced apart from the corresponding exterior portions 605*a*, 606*a*, and/or 610*a* in a direction toward processing region 504, defining an annular liner volume 617 between the exterior portions and interior portions. The interior portion 610*b* of pumping liner 610 may extend into the processing region 504 as defined above and may define an access diameter for substrate support 310. Thus, in embodiments, interior portion 605*b* and/or 610*b* may be spaced apart from exterior portions 605*a*, 610*b* by any amounts such that the access diameter as discussed above is maintained between interior portion 605*b* and substrate support 310. In embodiments, the interior portions 605*b*, 606*b*, and/or 610*b* may extend in a generally vertical manner from a position adjacent to an upper surface of substrate support 310 (e.g. with a gap maintained therebetween), such as when substrate support 310 is in a processing position, to a bottom wall 309 of the chamber body 305.

Stated differently, in embodiments, interior portion 606*b* of the enhancement liner may be spaced apart from exterior portion 606*a* in a radial direction extending from a common coaxial center point, so as to define an annular gap therebetween. Thus, in embodiments, interior portion 606*b* may have a third diameter D3, that is smaller than the outer diameter D1 of exterior portion 606*a* and/or second annular diameter D2 corresponding to the vertically extending portion 606*d*, where the first diameter, second diameter, and/or third diameter, may each share a coaxial center point. In embodiments, the interior portion 606*b* may be connected to exterior portion 606*a* via one or more supports 622. As illustrated, the one or more supports 622 may maintain an annular gap or radial distance between the interior portion 606*b* and exterior portion 606*a*, while allowing for flow of process gas into the gap from above top surface 624*a*. Namely, in embodiments, the interior portion 606*b* and exterior portion 606*b* may define, and at least partially enclose, an annular enhancement liner volume therebetween. Thus, the supports 622 may maintain the desired spacing between the interior portion 606*b* and exterior portion 606*a*, without interfering with the flow of gas into the annular enhancement liner volume.

As illustrated, a top surface 624*a* and an opposed bottom surface 624*b* of enhancement liner 606, which may extend in a direction generally perpendicular to the exterior portion 606*a* and interior portion 606*b* may be enclosed over a portion of the enhancement liner corresponding to the laterally extending portions 606*c*, defining some or all of the distribution volume 609. However, in embodiments, the top and/or bottom surface may be open or unenclosed at a portion corresponding to the annular enhancement liner volume. In such a manner, the enhancement liner may be fluidly connected to one or more additional liner volumes and/or exhaust volumes, as discussed herein. Thus, stated differently, in embodiments, a top and/or bottom surface extending between the first diameter D1 and second diameter D2 may include an enclosed top and/or bottom surface 624*a*/624*b*, whereas a top and/or bottom surface extending between the second diameter D2 and the third diameter D3 may contain a fully or partially open or unenclosed top surface and/or bottom surface. Thus, in embodiments, the one or more supports 622 may extend over a portion, but less than all, of a top surface 624*a* corresponding to the annular enhancement liner volume (e.g. top surface extending between D2 and D3), such that less than or about 90% of an area of the top surface 624*a* corresponding to the annular enhancement liner volume is enclosed, such as less than or about 80%, less than or about 70%, less than or about 60%, less than or about 50%, less than or about 40%, less than or about 30%, or any ranges or values therebetween. As will be discussed in greater detail, the total coverage or enclosure of top surface 624*a* may also include a portion of the top surface 624*a* enclosed by a notch 626.

Namely, in embodiments, a portion of the top and/or bottom surface extending between the second diameter D2 and third diameter D3 may be at least partially enclosed. For instance, as shown more clearly in FIG. 5C, in embodiments, it may be desired to include an access notch 626 around at least a portion of the enhancement liner. For instance, such a notch may allow for use of the enhancement liner in chambers having one or more access ports in a chamber sidewall. Thus, such a shape may allow for the enhancement liner to provide the cleaning benefits discussed herein, even when access to a side port is necessary. In such an embodiment, the exterior portion 606*a* and the interior portion 606*b* may have a total or maximum height extending from the top surface 624*a* to a bottom surface 624*b*. As discussed above, the interior portion 606*b* may have a total or maximum height less than a total or maximum height of exterior portion 606*a*, such as to provide access to an exhaust 612. Nonetheless, in embodiments, a portion of the exterior portion 606*a* and/or a portion of the interior portion 606*b* has a height less than the total or maximum height of the corresponding interior portion 606*b* and/or exterior portion 606*a*, corresponding to the location of notch 626. In embodiments, the reduced height may extend around a portion of the enhancement liner 606, such as greater than or about 10% of the perimeter of the enhancement liner 606 up to or about 50% of the perimeter, such as greater than or about 20%, greater than or about 25%, or such as less than or about 40%, or any ranges or values therebetween. However, it should be clear that the notch may be sized based upon the diameter of the substrate to be processed in the chamber. For instance, in such embodiments, the notch 626 may have an upper surface 628, that is disposed below top surface 624*a*.

Furthermore, as illustrated, the top 613 of liner 605 may be open or contain an opening so as to be fluidly connected to the processing region. 504. In embodiments, the top 613 of liner 605 may be directly open to the processing region 504, or may be fluidly connected via one or more additional components, such as through pumping liner 610.

Regardless of the orientation, the liner 605, enhancement liner 606, and/or pumping liner 610 define a liner volume 617 that extends around at least a portion of an interior of chamber body 305 and fluidly connects the cleaning gas source 514 with an exhaust outlet 612. As discussed above, exhaust outlet 612 may be a sole exhaust outlet for the system or may be a parallel exhaust outlet to an exhaust outlet coupled with the pumping liner plenum. The exhaust outlet 612 may be in fluid connection with an exhaust manifold via one or more valves 614. Surprisingly, due at least in part to orientation of the enhancement liner and distribution gap, alone or in combination with the short path length between the cleaning gas source 514 and the liner volume 617 and exhaust outlet 612, the processes and systems according to the present technology exhibit improved cleaning of one or more chamber components, such as the exhaust outlet 612, exhaust valve 614, liner(s) 605/610, and a process region facing surface 616 of faceplate 615.

Namely, in embodiments, the plurality of apertures 608 and distribution gap may be disposed at a location within the chamber body that is between an upper surface 311 of substrate support 310 (such as in a transfer position and/or a processing position) and bottom wall 309 of the chamber body 305. In embodiments, the plurality of apertures 608 may be formed through the exterior portion 606*a* of the enhancement liner at a height that is from about 1% to about 70% of a total height of sidewall 306 (e.g. height formed between bottom wall 309 and lid plate 405), such as from about 2.5% to about 65%, such as from about 5% to about 60%, such as from about 7.5% to about 55%, such as from about 10% to about 50%, such as from about 12.5% to about 45%, such as from about 15% to about 40%, such as from about 17.5% to about 35%, such as from about 20% to about 30%, or any ranges or values therebetween. In such as manner, as illustrated by radical flow path 611, the radicals formed by cleaning gas source 514 may flow through sidewall 306 of chamber body 305 through the cleaning has inlet 607, into the distribution gap 609, and through the plurality of apertures 608 and into liner volume 617. Thus, the radical flow path 611 may interact around the circumference of the liner volume, the process region facing surface 616 of faceplate 615, and pumping liner 610, as well as exhaust outlet 612 and valve(s) 614, all without traversing through faceplate 615 (such as occurs with a conventional cleaning system upstream of faceplate 615). Furthermore, the location of the apertures may further improve instances of backflow, providing for reduced instances of interaction of the cleaning gas in the processing region 504.

Looking again to FIGS. 5B and 5C an enhancement liner 606, according to any one or more embodiments discussed herein, is illustrated. As shown more clearly in FIGS. 5B and 5C, in embodiments, the cleaning gas inlet 607 (the location of which is illustrated by the dashed circle in the top-down view) and exhaust outlet 612 (the location of which is illustrated by the dashed circle in the top-down view) may not be disposed symmetrically within the chamber. In embodiments, an inlet notch 630 may be formed in exterior portion 606*a*, corresponding to a complementary gas inlet 607, in order to further direct flow into and around the distribution gap/volume. In the illustrated embodiment, the chamber may have a circular cross section, and the cleaning gas inlet 607 and exhaust outlet 612 are not disposed equidistantly (e.g. are not disposed across a diameter of the enhancement liner). In such embodiments, it may therefore be desired to alter the flow paths 611*a* and 611*b* of the cleaning gas to address any asymmetries in flow path length.

Thus, in embodiments, the first flow path 611*a* may have a shorter length along a first perimeter portion of the enhancement liner 606 from a cleaning gas inlet 607 to an exhaust outlet 612 than a flow path length along a second perimeter portion of the enhancement liner 606 of second flow path 611*b*. In embodiments, the first flow path 611*a* may have a path length that is greater than or about 5% less than a path length of the second flow path 611*b*, such as greater than or about 10%, greater than or about 15%, greater than or about 20%, greater than or about 25%, greater than or about 30%, greater than or about 35%, greater than or about 40% less than a path length of a second flow path 611*b*, or any ranges or values therebetween.

In such embodiments, in order to improve the flow uniformity between the first flow path 611*a* and second flow path 611*b*, the width (and thus the volume) of the distribution gap 609 may be increased for the longer path length of second flow path 611*b*, and decreased for the shorter path length of first flow path 611*a*. In embodiments, the second flow path 611*b* may have a distribution gap 609*b* width that is greater than or about 5% wider than a distribution gap 609*a* width of the first flow path 611*a*, such as greater than or about 7.5%, greater than or about 10%, greater than or about 12.5%, greater than or about 15%, greater than or about 17.5%, greater than or about 20%, greater than or about 22.5%, greater than or about 25%, greater than or about 27.5%, greater than or about 30%, greater than or about 32.5%, greater than or about 35%, greater than or about 37.5%, greater than or about 40%, greater than or about 42.5%, greater than or about 45%, greater than or about 47.5%, greater than or about 50%, or any ranges or values therebetween.

Stated differently, in embodiments, the second flow path 611*b* may have a flow conductance that is greater than or about 5% higher than a flow conductance of the first flow path 611*a*, such as greater than or about 7.5%, greater than or about 10%, greater than or about 12.5%, greater than or about 15%, greater than or about 17.5%, greater than or about 20%, greater than or about 22.5%, greater than or about 25%, greater than or about 27.5%, greater than or about 30%, greater than or about 32.5%, greater than or about 35%, greater than or about 37.5%, greater than or about 40%, greater than or about 42.5%, greater than or about 45%, greater than or about 47.5%, greater than or about 50%, or any ranges or values therebetween.

In embodiments, the distribution gap width may be altered by increasing or decreasing the thickness of the exterior portion 606*a* of enhancement liner 606 (e.g. increasing or decreasing the distance between exterior portion 606*a* and chamber sidewall 306, such as by increasing the width of vertically extending portion 606*d*), as illustrated by the magnified portion of FIG. 5B. In such a manner, the laterally extending portions 606*c* may maintain the spacing of the enhancement liner 606 from the chamber sidewall, while also allowing for an increase and decrease in a width of the distribution gap depending upon the direction travelled. Namely, in embodiments, a thickness of exterior portion 606_d_1 disposed along first flow path 611_a/a_ first perimeter portion may be greater than or about 5% wider than a thickness of exterior portion 606_d_2 disposed along second flow path 611_b/a_ second perimeter portion, such as greater than or about 7.5%, greater than or about 10%, greater than or about 12.5%, greater than or about 15%, greater than or about 17.5%, greater than or about 20%, greater than or about 22.5%, greater than or about 25%, greater than or about 27.5%, greater than or about 30%, greater than or about 32.5%, greater than or about 35%, greater than or about 37.5%, greater than or about 40%, greater than or about 42.5%, greater than or about 45%, greater than or about 47.5%, greater than or about 50%, or any ranges or values therebetween.

In embodiments, the thickness or width of the vertically extending portion 606_d_ (e.g. first flow path 611_a_ and/or second flow path 611_b_) may be greater than or about 0.1 cm, such as greater than or about 0.15 cm, such as greater than or about 0.2 cm, such as greater than or about 0.25 cm, such as greater than or about 0.3 cm, such as greater than or about such as greater than or about 0.35 cm, such as greater than or about 0.4 cm, such as greater than or about 0.45 cm, such as greater than or about 0.5 cm, such as greater than or about 0.55 cm, such as greater than or about 0.6 cm, such as greater than or about 0.75 cm, such as greater than or about 1 cm, or such as less than or about 1.5 cm, such as less than or about 1.25 cm, such as less than or about 1 cm, such as less than or about 0.75 cm, such as less than or about 0.7 cm, such as less than or about 0.65 cm, such as less than or about 0.6 cm, such as less than or about 0.55 cm, less than or about 0.5 cm, less than or about 0.45 cm, less than or about 0.4 cm, or any ranges or values therebetween.

Moreover, the apertures 608 of the present technology may be further tailored to improve the flow uniformity of the cleaning gas around the liner volume. As illustrated, the plurality of apertures 608 may extend through the entirety of the width or thickness of exterior portion 606_a_. Thus, in embodiments, the plurality of apertures 364 may be defined to have a size and shape to facilitate the flow of a fluid, such as a gas, from the distribution gap 609, through the plurality of apertures 608, and into liner volume 617. For example, in embodiments such as the embodiment as illustrated, all or a portion of the plurality of apertures 608 may have a circular shape. However, in other embodiments, all or a portion of the plurality of apertures may have any other shapes, including being ovoid, rectangular, square, triangular, a slit-shape, or the like, as well as combinations thereof.

Nonetheless, in embodiments, the size of the apertures, measured as the diameter (or equivalent diameter for non-circular shapes) may generally increase based upon the distance between the respective aperture and the cleaning gas inlet 607. For instance, in embodiments, the second flow path 611_b_/the second perimeter portion may contain larger apertures, on average, than apertures contained along first flow path 611_a_/the first perimeter portion, as the average aperture size increases moving along first flow path 611_a_ and second flow path 611_b_ approaching A', thus allowing further control over the flow uniformity. In embodiments, one or more apertures disposed along second flow path 611_b_ may have a diameter (or equivalent diameter) that is greater than or about 5% larger than a diameter of one or more apertures disposed along first flow path 611_a_, such as greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, or any ranges or values therebetween.

Nonetheless, in embodiments, all or a portion of the plurality of apertures may have an average diameter (or equivalent diameter) of greater than or about 0.1 cm, such as greater than or about 0.15 cm, such as greater than or about 0.2 cm, such as greater than or about 0.25 cm, such as greater than or about 0.3 cm, such as greater than or about such as greater than or about 0.35 cm, such as greater than or about 0.4 cm, such as greater than or about 0.45 cm, such as greater than or about 0.5 cm, such as greater than or about 0.55 cm, such as greater than or about 0.6 cm, such as greater than or about 0.75 cm, such as greater than or about 1 cm, or such as less than or about 1.5 cm, such as less than or about 1.25 cm, such as less than or about 1 cm, such as less than or about 0.75 cm, such as less than or about 0.7 cm, such as less than or about 0.65 cm, such as less than or about 0.6 cm, such as less than or about 0.55 cm, less than or about 0.5 cm, less than or about 0.45 cm, less than or about 0.4 cm, or any ranges or values therebetween.

In embodiments, the plurality of apertures may include a first plurality of apertures adjacent to the cleaning gas inlet 607 and a second plurality of apertures disposed opposite the first plurality of apertures (e.g. adjacent to A' along line A-A') along exterior surface 606_a_. In embodiments, the second plurality of apertures may have a larger diameter, on average, than the first plurality of apertures. Nonetheless, in embodiments, the first plurality of apertures and the second plurality of apertures may have a diameter according to any one or more of the above values. Moreover, in embodiments, the plurality of apertures may have diameters that gradually increase when moving from cleaning gas inlet 607 or inlet notch 630 towards a portion of enhancement liner 606 opposite the cleaning gas inlet 607 or inlet notch 630 (e.g. adjacent to A' along line A-A'). In embodiments, when moving along first flow path 611_a_ and/or second flow path 611_b_ away from cleaning gas inlet 607 or notch 630, all of a portion of a the apertures may have a larger diameter than the preceding aperture, such as greater than or about 2% larger, greater than or about 3%, greater than or about 4%, greater than or about 5% larger, greater than or about 6% larger, greater than or about 7% larger, greater than or about 8% larger, greater than or about 9% larger, greater than or about 10% larger, or any ranges or values therebetween. Nonetheless, in embodiments, the apertures may have a similar diameter around the perimeter of the enhancement liner, and the distribution gap may instead be utilized alone to compensate for differences in flow conductance.

As known in the art, radicals, including cleaning gas radicals formed from fluorine and oxygen containing precursors, tend to recombine with other gas particles or contaminants. Therefore, the longer the flow path and the more difficult the path is to traverse, results in less radicals available for cleaning. As discussed above, conventional cleaning systems flow radicals from a position upstream of faceplate 615. Any radicals must therefore pass through the faceplate apertures. As the apertures tend to be quite small, there is a large surface area for the radicals to interact with, leading to a high percentage of the radicals recombining with other gas radicals or compounds found on the faceplate. Such a phenomenon leads to a low percentage of radicals remaining in the cleaning gas by the time flow is experienced in the processing region 504 or elsewhere in chamber body 305. Furthermore, existing RPS units, such as unit 515 discussed above, are unable to produce both process precursors and cleaning gasses simultaneously while also adhering to necessary process conditions.

Surprisingly, due at least in part to the lack of necessity of traversing faceplate 615 and the apertures therein, a large percentage of radicals according to the present technology form all or part of the cleaning gas entering the liner volume 617. Moreover, as discussed below, the present technology has found that by mounting or otherwise disposing the cleaning gas source 514 below chamber 300, the radical path length may be formed to be desirably short, while also maintaining the existing footprint of the system. Thus, surprisingly, the processes and systems discussed herein are able to greatly improve the cleaning of processing residues, even with reduced cleaning gas volume.

Furthermore, due to the unique location of apertures 608 and cleaning gas source 514, and by including a standalone cleaning gas source in addition to a process RPS (such as RPS 515), the cleaning gas generated by the cleaning gas source 514 may be flowed during processing operations as well as conventional clean operations. In such a manner, the cleaning gas generated by the cleaning gas source 514 may interact with processing residues 604 during processing, binding with the processing residues prior to the residue depositing on a surface of the one or more chamber components. Thus, the present technology may not only provide an enhanced clean, but may prevent deposits that drive the necessity for a full clean operation discussed above, which requires significant down time of the system due to the cooling and seasoning of the chamber. Moreover, due at least in part to the unique location of the one or more inlet apertures and cleaning RPS, the cleaning gas generated by the cleaning RPS may be flowed during conventional cleaning operations, reducing the cleaning gas needed to be introduced from upstream of faceplate 615. Such a process greatly reduces the volume of cleaning gas necessary for cleaning, and also significantly reduces the time necessary for cleaning. Thus, the present technology provides for enhanced cleaning operations that utilize a reduced volume of cleaning gas as well as reduced cleaning time.

Nonetheless, in embodiments, it may be desirable to isolate the exhaust outlet 612 from a purge volume 506 to reduce the area for cleaning as well as the necessary volume of cleaning gas from cleaning gas source 514. The purge volume 506 may be generally defined by the substrate support 310, sidewalls 306, and bottom wall 309 when the substrate support 310 is in the processing position. The purge volume 506 may be fluidly connected to a purge gas source via inlet 308.

Figure 6:
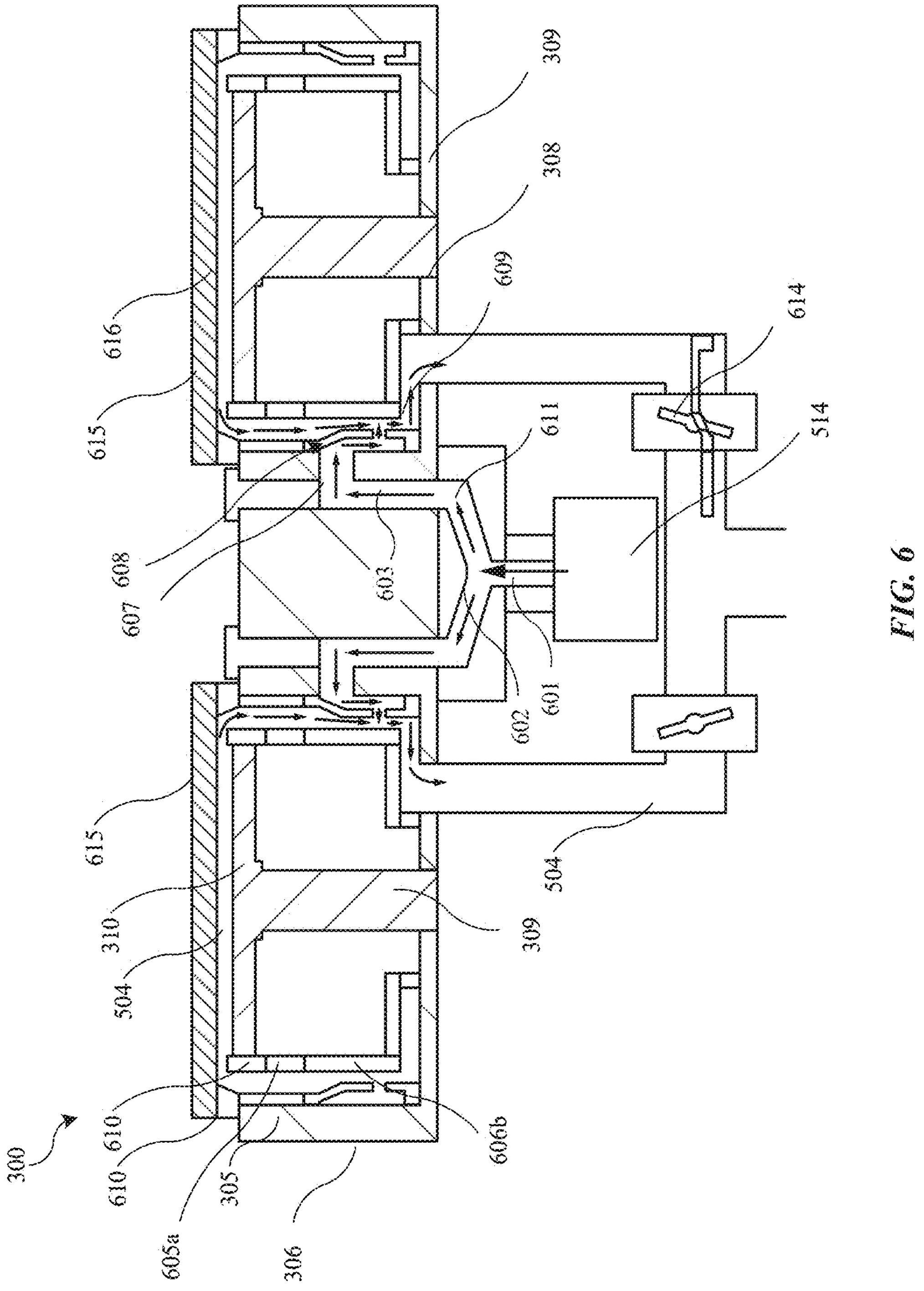
FIG. 6 shows a schematic view of an exemplary chamber system according to some embodiments of the present technology.
Figure 7:
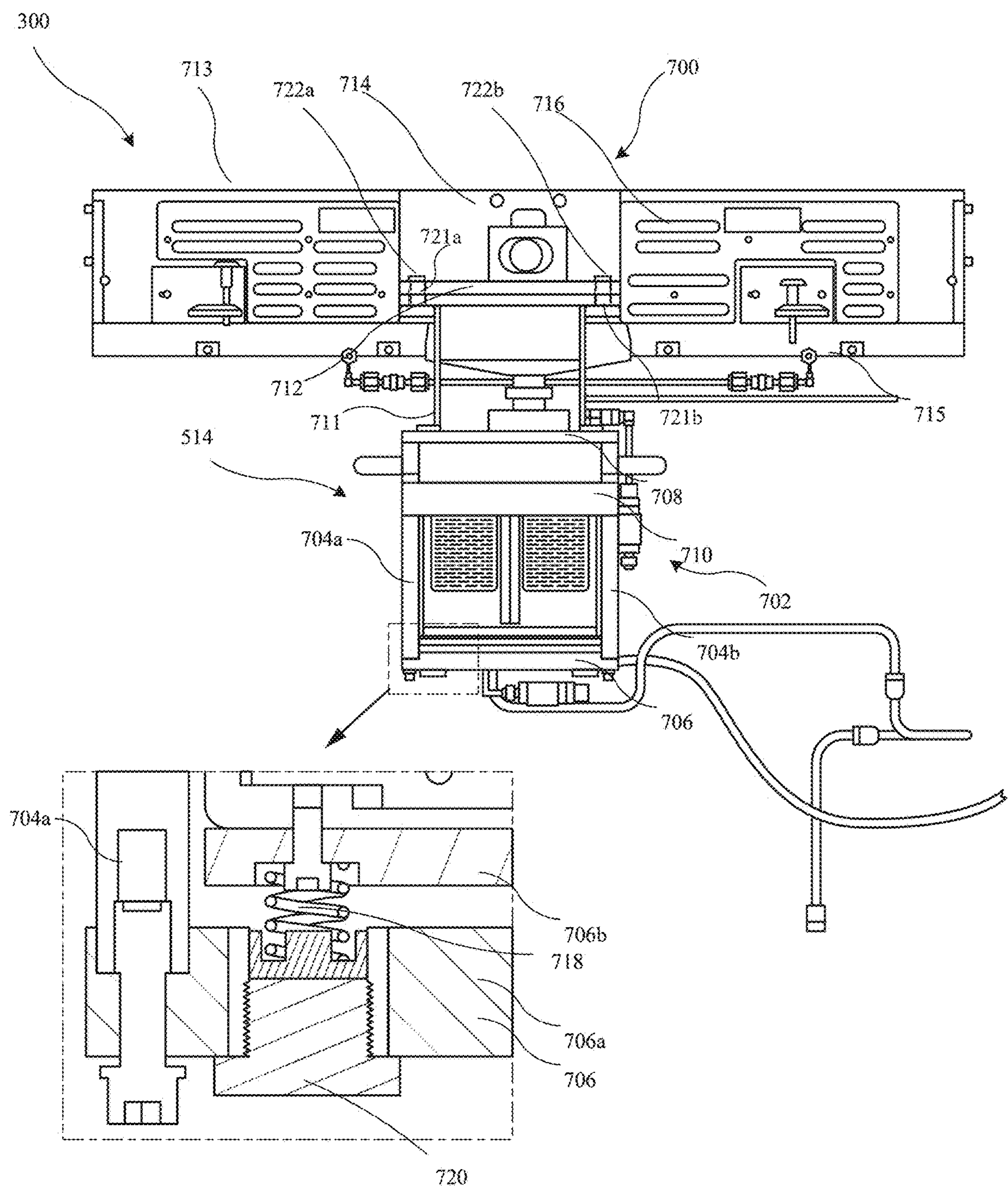
FIG. 7 shows schematic partial cross-sectional view of an exemplary chamber system according to embodiments of the present technology.

While FIGS. 5A-5C illustrates a single chamber and FIG. 6 illustrates a double chamber, it should be understood that the cleaning gas source 514 may be utilized with more than two chambers, such as four chambers or more, concurrently, as well as any one or more of the chambers discussed above. As illustrated in FIG. 6, in such embodiments, the cleaning gas source 514 may be fluidly connected to two or more chambers 300, forming a radical flow path 611 to each chamber 300. While other structures may be utilized, in embodiments, a radical inlet 601 may be attached to a splitter 602. Splitter 602 may be fixedly or releasably attached to radical inlet 601, such as using one or more clamps, and may contain a number of flow paths equal to the number of connected chambers. Nonetheless, splitter 602 may direct radicals along flow path 611 through one or more connectors 603, into cleaning gas inlet 607 and distribution gap 609, and through the one or more apertures 608. Thus, the present technology may be utilized for cleaning multiple chambers simultaneously, in embodiments.

Surprisingly, the present technology has found that by utilizing a tailored mounting bracket, the cleaning gas source 514 (e.g. an additional RPS or cleaning gas source from the plasma and cleaning gas sources discussed above) may be utilized as discussed above without increasing the footprint of current chambers 300 or inhibiting the function of chamber 300. Looking to FIG. 7, cleaning gas source 514 may be attached to chamber 300 via mounting assembly 700. Namely, by utilizing the mounting assembly 700 discussed herein, the cleaning gas source 514 may be disposed vertically below chamber 300 without contacting or damaging the critical components located on a bottom surface of the chamber. By utilizing such a mounting assembly, an additional cleaning gas source may be incorporated into chamber 300 without inhibiting function or increasing the footprint of the system, while also providing adequate support for the cleaning gas source and any changes exhibited therefrom during processing.

In embodiments, mounting assembly 700 may include a support frame 702 having two or more opposed side supports 704*a*, 704*b*, a bottom support 706, and an opposed upper support 708. The cleaning gas source 514 may be seated on bottom support 706 and may be laterally supported by the opposed side supports 704*a*, 704*b*. In addition, upper support 708 may provide one or more mounting surfaces for support arms 711. In embodiments, it may be desirable to include one or more braces 710, which may connect opposed sides 708*a*, 704*b*, and/or opposed bottom and upper supports 706, 708, and which may provide additional support if needed. While the support frame 702 is illustrated as having one or more open sides, it should be clear that, in embodiments, some or all of the cleaning gas source 514 may be contained within a solid housing.

Nonetheless, support frame 702 may be supported by a mounting bar 712 fixedly or releasably attached to mounting plate 714. In embodiments, mounting bar may be fixedly or releasably attached to support arms 711, which may extend from upper support 708 to mounting bar 712, and may therefore firmly support the support frame 702 against mounting plate 714. Mounting plate 714 may be removably or permanently affixed to a side 716 of chamber 300, such as a lateral side disposed between an opposed upper surface 713 and lower surface 715 of chamber 300, in embodiments. In embodiments, the mounting plate 714 may be generally located along a central axis of chamber 300, as shown more clearly in FIGS. 8A-8C. The mounting plate may allow the force of the cleaning gas source 514 to be distributed, allowing the mounting assembly 700 to provide a stable base for cleaning gas source 514.

In embodiments, the support frame 702 may also include one or more tension components 718. In embodiments, the tension component 718 may be a spring or similar component that allows for some expansion of the frame while maintaining proper support. In the illustrated embodiment, the tension component 718 may include one or more springs which are initially tensioned by an attachment piece 720, such as a threaded screw. By utilizing such a combination, the tension component may be applied with a proper initial tension, allowing for a strong balance between support and flexibility during processing conditions. Namely, it is common for remote plasma sources, such as the inlet 601 and/or splitter 602, to expand during plasma generation due to thermal expansion. Thus, the design of the present technology allows the load to be transferred to mounting plate 714 while also accounting for thermal expansion during processing. In such embodiments, bottom support 706 may include a first plate 706*a* and a second plate 706*b*. First plate 706*a* may be attached to opposed sides 704*a*, 704*b* of the support frame 702 as discussed above, while second plate 706*b* may be supported via first plate 706*a* and one or more tension components 718.

Figure 8A:
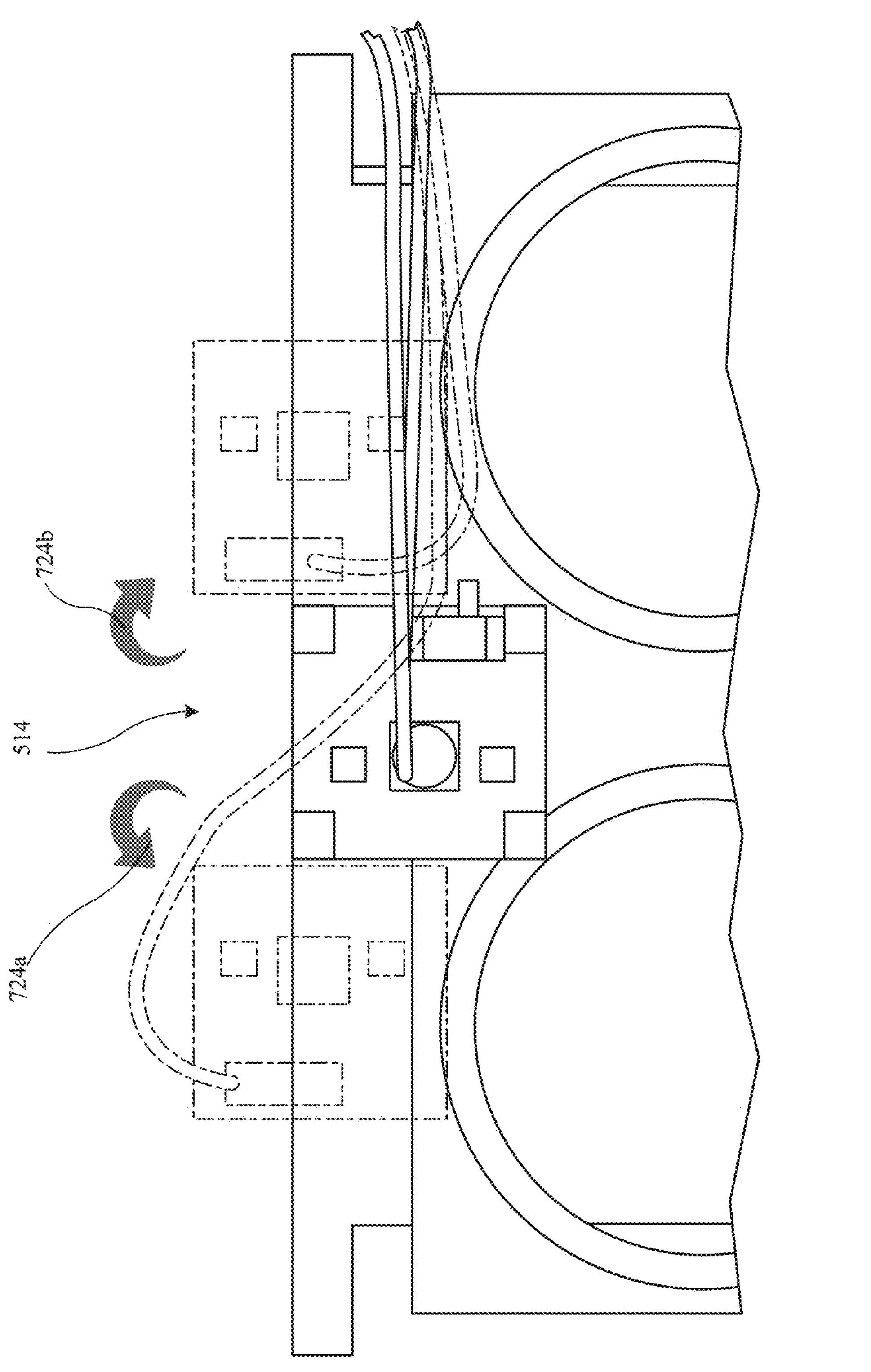
FIG. 8A shows a top-down schematic view of an exemplary chamber system according to embodiments of the present technology.
Figure 8B:
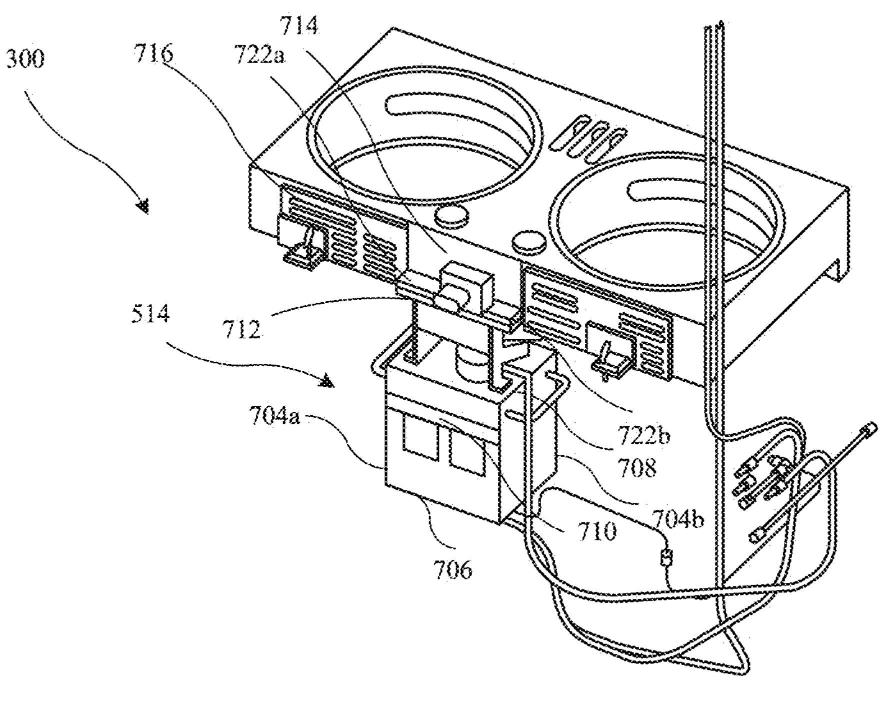
FIG. 8B shows a chamber system according to embodiments of the present technology.
Figure 8C:
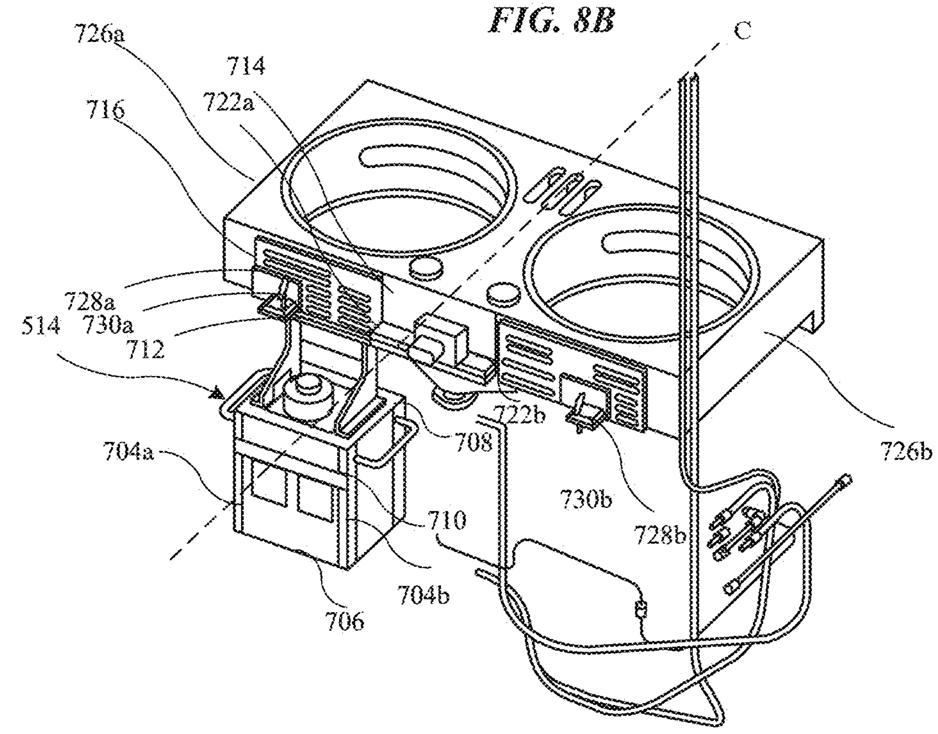
FIG. 8C shows a chamber system according to embodiments of the present technology with a cleaning remote plasma source in a chamber access position.

In embodiments, mounting bar 712 may be releasably affixed to mounting plate 714 via one or more translatable attachments 722*a*, 722*b* extending through attachment housing 721*a*, 721*b*. Referring to FIGS. 8A-8C, by utilizing one or more translatable attachments 722, the cleaning gas source 514 may be translated to the left or right as illustrated by arrows 724. For instance, by removing first translatable attachment 722*a* (FIG. 7), the entire cleaning gas source 514 may be translated as illustrated by arrow 724*b* around second translatable attachment 722*b*. Similarly, by removing second translatable attachment 722*b*, the entire cleaning gas source 514 may be translated as illustrated by arrow 724*a* around first translatable attachment 722*a*. Namely, the remaining translatable attachment (e.g. non-removed attachment) may serve as an axis of rotation of which the cleaning RPS may rotate around and outward from side surface 716 of cleaning gas source 514. In such a manner, the cleaning RPS may be moved from a central location to a secondary side location, allowing for access to one or more chambers adjacent to the removed translatable attachment. In embodiments, the translatable attachment 722 may be a screw, bar, rivet, or the like, as known in the art.

For instance, FIGS. 8B and 8C illustrate an embodiment where second translatable attachment 722*b* is removed from the structure shown in FIG. 8B. After removal of translatable attachment 722*b*, cleaning gas source 514 may be translated from a first central position to a secondary position. As illustrated, in embodiments, the secondary position may be located at a position between a central axis C of chamber 300 and an outer edge 726*a*, 726*b* of chamber 300. In embodiments, chamber 300 may include one or more secondary mounting plates 728*a*, 728*b*. When utilized, the one or more secondary mounting plates 728*a*, 728*b* may include a secondary mounting pin 730*a*, 730*b*. The mounting pins may be shaped and sized so as to correspond to the housing 721*a*, 721*b* vacated by the removed translatable attachment (such as through a screw hole or the like), and retain the cleaning gas source 514 in the secondary location. In embodiments, the cleaning gas source 514 may be retained in the second position during a cleaning or service operation.

Nonetheless, after the access to the desired chamber portion is complete, the secondary mounting pin 730*a* may be released. By releasing the secondary mounting pin, the cleaning gas source 514 may be rotated around first translatable attachment 722*a*, toward the central location, and re-affixed to second translatable attachment 722*b*. Moreover, referring to FIG. 8A, it should be understood that the cleaning gas source 514 may be translated towards a first side 726*a* or a second side 726*b*, based upon the translatable attachment removed.

Figure 9:
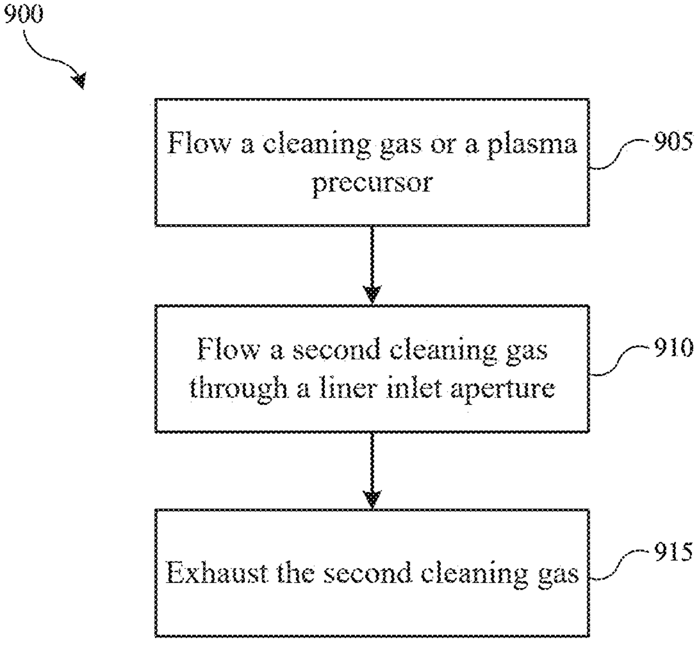
FIG. 9 shows operations of an exemplary method of processing a substrate according to some embodiments of the present technology.

FIG. 9 shows operations of an exemplary method 900 of substrate processing according to some embodiments of the present technology. The method may be performed in a variety of processing chambers, including processing systems and chambers 100, 200, and 300 described above, which may include the cleaning RPS and pumping liner discussed above. Method 900 may include a number of optional operations, which may or may not be specifically associated with some embodiments of methods according to the present technology.

Method 900 may include a method that may include optional operations prior to initiation of method 900, or the method may include additional operations. For example, method 900 may include operations performed in different orders than illustrated. Nonetheless, in embodiments, method 900 may include an operation 905 of flowing a cleaning gas or a plasma precursor into a processing chamber. In embodiments, the processing chamber may be any chamber discussed in regards to the processing systems above. The method may include optionally evacuating the cleaning gas or plasma precursor from the chamber prior to flowing the second cleaning gas at operation 910, or may include flowing the second gas simultaneously with operation 905.

Nonetheless, in embodiments, operation 910 may be conducted by a secondary cleaning gas source. As discussed above, the secondary cleaning gas source may be fluidly coupled with an inlet of a chamber sidewall. The inlet may be advantageously located below a faceplate or processing region of the chamber. Thus, the cleaning gas from the secondary cleaning gas source may be flowed directly from the cleaning gas source through the inlet into a distribution gap, and distributed into a liner volume through one or more apertures. Furthermore, the cleaning gas from the secondary cleaning gas source may be exhausted at operation 915 without requiring the cleaning gas to traverse through one or more faceplate apertures. By providing the secondary cleaning gas source and enhancement liner according to the present technology, increased cleaning of components downstream of a faceplate may be exhibited. Moreover, in embodiments, such a system and process may allow for fewer deposits to be formed, alone or in conjunction with requiring smaller cleaning gas volumes, as the process may be run concurrently with a cleaning or deposition operation due at least in part to the location of the secondary cleaning gas source and enhancement liner. In embodiments, the present technology may be well suited for removing or combining with one or more carbon containing compounds, such as one or more carbon containing compounds formed or utilized during a CVD process, as an example only.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a heater” includes a plurality of such heaters, and reference to “the aperture” includes reference to one or more apertures and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A substrate processing system, comprising:

a chamber body that defines a processing region;

an enhancement liner, positioned within the chamber body, comprising an interior portion, an exterior portion, and a plurality of apertures, wherein the enhancement liner defines a liner volume between the interior portion and the exterior portion, and wherein a distribution gap is defined between the enhancement liner and a sidewall of the chamber body;

a faceplate disposed vertically above the enhancement liner; and a cleaning gas source coupled with the distribution gap through an inlet in the sidewall of the chamber body; and wherein the exterior portion of the enhancement liner comprises a laterally extending portion and a vertically extending portion, and wherein the laterally extending portion extends from the sidewall of the chamber body towards a substrate support disposed in the processing region.

2. The substrate processing system of claim 1, wherein:

the cleaning gas source is positioned vertically below the chamber body.

3. The substrate processing system of claim 1, wherein:

the plurality of apertures fluidly connect the distribution gap and the liner volume.

4. The substrate processing system of claim 1, wherein:

the vertically extending portion is laterally spaced apart from the sidewall of the chamber body towards the substrate support.

5. The substrate processing system of claim 1, wherein:

the enhancement liner defines a first cleaning gas flow path between the inlet and an exhaust outlet and a second cleaning gas flow path between the inlet and the exhaust outlet, and wherein a length of the first cleaning gas flow path is less than a length of the second cleaning gas flow path.

6. The substrate processing system of claim 5, wherein:

the distribution gap comprises a gap width between the sidewall of the chamber body and the vertically extending portion, and wherein a gap width of the distribution gap along the first cleaning gas flow path is greater than a gap width of the distribution gap along the second cleaning gas flow path.

7. The substrate processing system of claim 5, wherein:

a portion of the plurality of apertures are disposed along the first cleaning gas flow path and a portion of the plurality of apertures are disposed along the second cleaning gas flow path, and a diameter or equivalent diameter of one or more apertures of the plurality of apertures disposed along the second cleaning gas flow path is greater than a diameter or equivalent diameter of one or more apertures of the plurality of apertures disposed along the first cleaning gas flow path.

8. The substrate processing system of claim 1, wherein:

the plurality of apertures are disposed along the exterior portion at a height less than a height of a substrate support in a processing position.

9. The substrate processing system of claim 1, further comprising:

a liner, seated on the enhancement liner, comprising an interior portion and an exterior portion, wherein the interior portion and the exterior portion of the liner defines a portion of the liner volume, and a pumping liner seated on the liner.

10. The substrate processing system of claim 9, further comprising a lower liner fluidly connecting an exhaust outlet to the liner volume.

11. The substrate processing system of claim 1, wherein the exterior portion of the enhancement liner comprises a first laterally extending portion and a vertically extending portion, wherein the first laterally extending portion extends from the sidewall of the chamber body towards a substrate support disposed in the processing region.

12. The substrate processing system of claim 11, further comprising:

a second laterally extending portion, wherein the vertically extending portion extends between the first laterally extending portion and the second laterally extending portion, and wherein the plurality of apertures are formed in the vertically extending portion.

13. A processing method, comprising:

flowing a first cleaning gas or a plasma precursor into a processing region of a semiconductor processing chamber, the semiconductor processing chamber comprising:

an enhancement liner positioned within the semiconductor processing chamber comprising an interior portion, an exterior portion, and a plurality of apertures, wherein the enhancement liner defines a liner volume between the interior portion and the exterior portion, wherein a distribution gap is defined between the enhancement liner and a sidewall of the semiconductor processing chamber, wherein the exterior portion of the enhancement liner comprises a laterally extending portion and a vertically extending portion, and wherein the laterally extending portion extends from the sidewall of the semiconductor processing chamber towards a substrate support disposed in the processing region;

a faceplate disposed vertically above the enhancement liner;

a second cleaning gas source coupled with the distribution gap through an inlet in the sidewall of the semiconductor processing chamber; and flowing a second cleaning gas from the second cleaning gas source into the distribution gap through the inlet; and exhausting the second cleaning gas through the liner volume.

14. The processing method of claim 13, wherein:

the first cleaning gas is flowed into the processing region and the second cleaning gas is flowed into the distribution gap simultaneously with the flowing of the first cleaning gas into the processing region.

15. The processing method of claim 13, wherein:

the plasma precursor is flowed into the processing region, and the second cleaning gas is flowed into the distribution gap simultaneously with the flowing of the plasma precursor into the processing region.

16. The processing method of claim 15, wherein the plasma precursor comprises a carbon containing precursor.

* * * * *